(12) United States Patent
Hirata et al.

(10) Patent No.: US 7,980,716 B2
(45) Date of Patent: *Jul. 19, 2011

(54) FRONT SHEET AND DISPLAY DEVICE USING THE SAME

(75) Inventors: Koji Hirata, Yokohama (JP); Kei Adachi, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/848,553

(22) Filed: Aug. 2, 2010

(65) Prior Publication Data

US 2010/0315819 A1    Dec. 16, 2010

Related U.S. Application Data

(63) Continuation of application No. 11/802,089, filed on May 18, 2007, now Pat. No. 7,791,257.

(30) Foreign Application Priority Data

May 18, 2006    (JP) ................. 2006-138435

(51) Int. Cl.
*H01K 1/26* (2006.01)
(52) U.S. Cl. .......................... 362/97.1; 362/616
(58) Field of Classification Search ............ 362/97.1, 362/97.4, 606, 607, 616, 618, 620; 359/599, 359/601, 609, 614
See application file for complete search history.

(56) References Cited

U.S. PATENT DOCUMENTS

| | | | |
|---|---|---|---|
| 3,279,314 A | 10/1966 | Miller | |
| 6,040,029 A | 3/2000 | Yamamoto et al. | |
| 6,636,355 B2 | 10/2003 | Moshrefzadeh et al. | |
| 6,650,481 B2 | 11/2003 | Osawa et al. | |
| 7,218,043 B2 | 5/2007 | Hong et al. | |
| 7,253,955 B2 | 8/2007 | Watanabe et al. | |
| 7,576,915 B2 * | 8/2009 | Kurt .............................. | 359/599 |
| 2005/0162087 A1 | 7/2005 | Kim et al. | |
| 2005/0190321 A1 | 9/2005 | Ohsawa | |
| 2006/0142412 A1 | 6/2006 | Yamaoka et al. | |
| 2007/0228965 A1 | 10/2007 | Cha et al. | |
| 2007/0285790 A1 | 12/2007 | Yoon et al. | |

FOREIGN PATENT DOCUMENTS

| | | |
|---|---|---|
| CN | 1483156 A | 3/2004 |
| EP | 1 482 331 A1 | 12/2004 |
| JP | 10-20798 | 1/1998 |

(Continued)

OTHER PUBLICATIONS

Entire prosecution history of Hirata et al., U.S. Appl. No. 11/802,089, filed May 18, 2007, entitled "Front Sheet and Display Device using the Same".
European Search Report, issued in corresponding European Patent Application No. 07252008.3-1234, dated on Aug. 27, 2007.
Chinese Office Action issued in Chinese Patent Application No. 200710103867X, dated Aug. 22, 2008.
English translation of Chinese Office Action issued in Chinese Patent Application No. CN 200710103867X dated Jun. 5, 2009.

*Primary Examiner* — Y My Quach Lee
(74) *Attorney, Agent, or Firm* — McDermott Will & Emery LLP

(57) ABSTRACT

A technique for a display device using a display panel with Lambert light distribution, such as a plasma display panel, which displays a bright image with less contrast deterioration. This device has a front sheet which is integrally or separately located in front of the display panel. The front sheet includes light guides which extend in the horizontal direction and have a virtually convex cross section in the vertical direction with their apexes on the light exit side. A light reflection layer and a light-absorbing layer are sequentially stacked on the lateral sides of the light guides.

12 Claims, 8 Drawing Sheets

FOREIGN PATENT DOCUMENTS

| | | |
|---|---|---|
| JP | 10-83531 | 3/1998 |
| JP | 2001-154597 | 6/2001 |
| JP | 2002-260539 | 9/2002 |
| JP | 2002-311211 A | 10/2002 |
| JP | 2003-005663 | 1/2003 |
| JP | 2003178683 A * | 6/2003 |
| JP | 2005-22365 A | 1/2005 |
| JP | 2005-84477 | 3/2005 |
| JP | 2005-129532 A | 5/2005 |
| JP | 2006-146093 | 6/2006 |
| WO | WO 97/22896 | 6/1997 |
| WO | WO 2005/116740 A1 | 12/2005 |

* cited by examiner

FRONT SHEET AND DISPLAY DEVICE USING THE SAME

RELATED APPLICATIONS

The present application is a Continuation of U.S. application Ser. No. 11/802,089, filed on May 18, 2007 now U.S. Pat. No. 7,791,257, which claims priority from Japanese application serial no. JP 2006-138435, filed on May 18, 2006, the entire contents of each of which are hereby incorporated by reference into this application.

BACKGROUND OF THE INVENTION (1) Field of the Invention

The present invention relates to a front sheet on the front side of a display panel such as a plasma display panel (PDP) and a display device using the same.

(2) Description of the Related Art

In a display device which uses a light-emitting display panel such as the plasma display panel (PDP) and a field emission display (FED), a front sheet (also called an optical filter) is attached to the front side of the display panel in order to improve contrast in a bright room by reduction of external light reflection.

Japanese Patent Application Laid-Open Publication No. 2001-154597 and Japanese Patent Application Laid-Open Publication No. 2005-129532 describe this kind of front sheet. These patent documents disclose techniques that a front sheet includes striped light-absorbing layers (light-shielding layers) for absorbing or shielding external light, and a light focusing part for focusing light from the display panel is provided in the light-transmitting area between such light-absorbing layers.

SUMMARY OF THE INVENTION

The above former techniques use semicylindrical lenticular lenses as the above light focusing parts. The lenticular lenses can focus light properly when incident light rays are almost parallel (the traveling direction of incident light is almost equal to the front plate's normal line direction).

However, the light intensity distribution (light emitting pattern) of light emitted from a display panel like a PDP is virtually uniform or Lambert distribution where light is emitted in a radial pattern. When the lenticular lenses as described by the former techniques are used, it is difficult to focus radial light rays on the light-transmitting area between light-absorbing layers. For this reason, in the former techniques, part of light from the display panel entering the front sheet is absorbed by the light-absorbing layers and thus the intensity of light emitted from the front sheet decreases. In other words, the transmittance of the front sheet becomes lower, which may lead to a decline in the brightness of a displayed image.

The present invention provides a technique for displaying a bright image while suppressing contrast deterioration.

The present invention is characterized in that a front sheet includes a plurality of light guides arranged in a vertical direction, each such light guide extending in the display panel's horizontal direction and having a convex cross section in the display panel's vertical direction, and an apex of the light guide is a light-transmitting area and a light reflection layer and a light-absorbing layer are sequentially stacked on the light guide's area other than the light-transmitting area.

With the above structure, the display panel's inherent directional characteristics in the horizontal direction are maintained properly while deterioration in the front sheet's transmittance for outgoing light is suppressed. In addition, since the light-absorbing layer covers the light guide except the light-transmitting area of the apex of the light guide, contrast is improved.

Therefore, according to the present invention, a bright image is displayed with less contrast deterioration.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Figure 1:
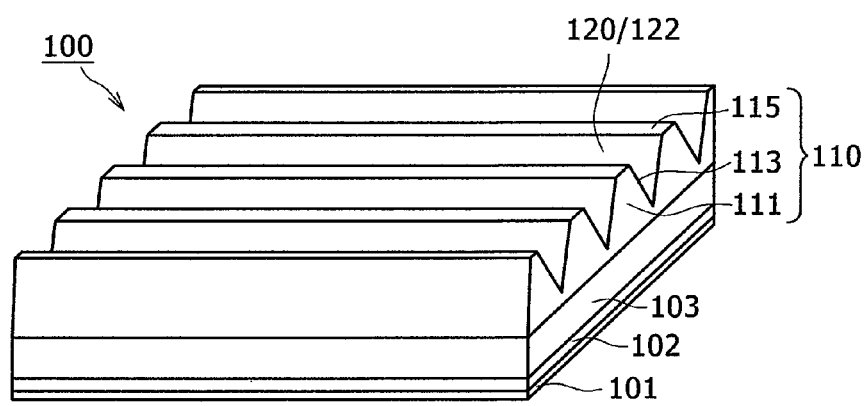
FIG. 1 is a perspective view of the main part of a display device according to a first embodiment of the present invention.
Figure 1:
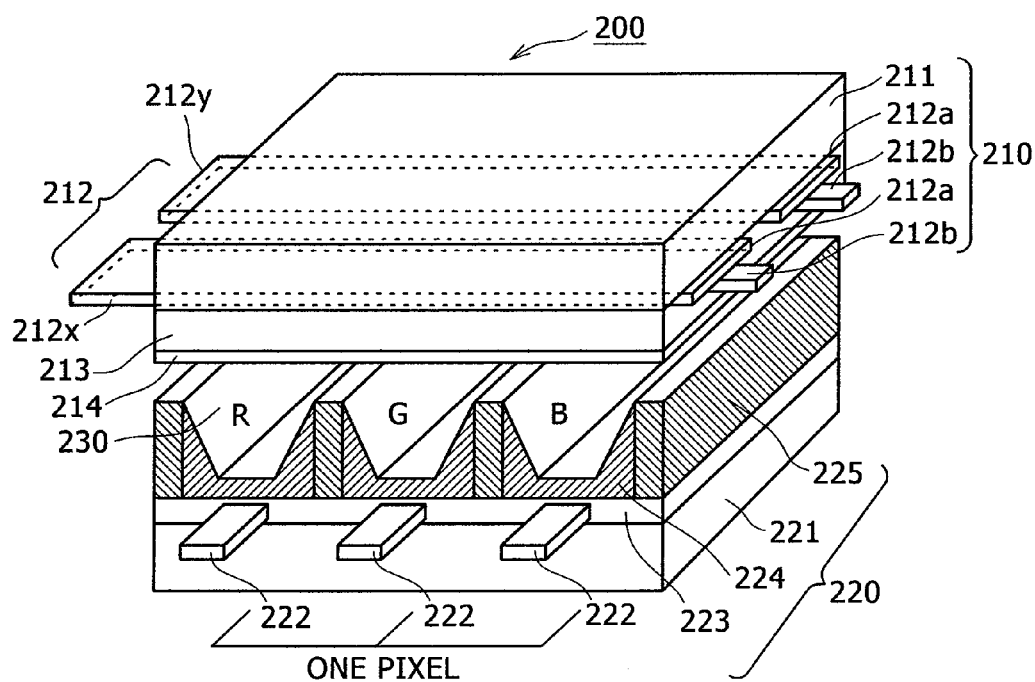

Next, preferred embodiments of the present invention will be described in detail referring to the accompanying drawings. In the drawings, elements with like functions are designated by like reference numerals and elements once described are not described again.

A front sheet (hereinafter called a front plate) according to a preferred embodiment of the present invention is applied to a display panel in which light-emitting pixels which emit light in a virtually Lambert distribution pattern are arranged in a matrix pattern. Such display panels include PDPs, FEDs, LED panels in which LEDs (light emitting diodes) are arranged in a matrix pattern, and EL panels in which ELs (electroluminescent lamps) are arranged in a matrix pattern. This front plate is integrally or separately attached to the front side of the display panel.

These preferred embodiments of the present invention are characterized in that such front sheet includes light guides which extend horizontally (screen horizontal direction of the display panel) and have a cross section in a vertical direction (screen vertical direction of the display panel) which is virtually convex with its apex on the light exit side, and the apex of the light guide is a light-transmitting area which transmits light, and a light reflection layer and a light-absorbing layer are sequentially stacked on the light guide's area other than its apex, or its lateral inclined portion (side face). This makes it possible to improve daylight contrast while maintaining good directional characteristics in the horizontal direction of the display panel. Here, "virtually convex" refers to a tapered shape which becomes narrower toward the light exit side. For example, it may be a trapezoid with its apex as the upper edge.

In the explanation given below, it is assumed that the display panel is a PDP. However, the present invention is not limited thereto.

First Embodiment

FIG. 1 is a perspective view of the main part of a display device according to a first embodiment of the present invention. To facilitate understanding of the PDP structure, FIG. 1 shows an upper panel and a lower panel separately.

As illustrated in FIG. 1, a front plate 100 is located in front of a PDP 200 at a given distance from it. First, the structure of the PDP 200 is explained below.

The PDP 200 includes an upper panel 210 and a lower panel 220 which are opposite to each other. First, an explanation is given of the upper panel 210. The upper panel 210 has an upper glass substrate 211 as a display side substrate on which display electrodes 212 extend horizontally in a striped pattern. The display electrodes 212 include an X display electrode (also called a common electrode) 212x and a Y display electrode (also called a scanning electrode) 212y which are opposite and parallel to each other constituting a pair where each display electrode consists of a transparent electrode 212a and a metal auxiliary electrode 212b for decreasing the resistance. Only one pair of display electrodes 212 (212x, 212y) is shown here. A dielectric layer 213 is formed over the display electrodes 212 in a way to cover them and a thin MgO protective coating 214 is made over the dielectric layer 213 in a way to cover it.

Next, an explanation is given of the lower panel 220. In the lower panel 220, address electrodes 222, which extend in a vertical direction perpendicularly to the display electrodes 212 and are arranged in a striped pattern in parallel with each other, lie on a lower glass substrate 221 as a back side substrate horizontally at regular intervals. A dielectric layer 223 is formed on the address electrodes 222 in a way to cover them, and partition walls 225 are formed on the dielectric layer 223 in parallel with the address electrodes 222 at regular intervals in a way to sandwich the address electrodes 222. Red (R), green (G), and blue (B) phosphors 224, corresponding to three neighboring address electrodes 222 which make up one pixel, are coated on the divisions of the dielectric layer 223 made by the partition walls 225.

The upper panel 210 and lower panel 220 thus structured are disposed so that the display electrodes 212 and the address electrodes 222 are opposite and perpendicular to each other and the panels are sealed together using frit glass or similar means (not shown). Consequently, plural discharge cells (discharge spaces) 230 are produced at points where the display electrodes of the upper panel perpendicularly intersect with the address electrodes of the lower panel. Each discharge cell 230 is filled with discharge gas such as gas mixed with neon (Ne) or xenon (Xe) at a prescribed pressure.

In the PDP 200 thus structured, first a driver circuit (not shown) applies a voltage to the address electrodes 222 and the Y display electrode 212y (this process is called address drive) to generate wall discharge; then voltages with opposite polarities (sustain voltages) are applied to the X display electrode 212x and the Y display electrode 212y alternately (this process is called main discharge drive) to sustain the discharge. As the electrodes are energized in this way, the discharge cells 230 discharge electricity and generate ultraviolet rays. The ultraviolet rays excite the phosphors 224 and let them generate red, green, and blue visible light rays which then pass through the upper glass substrate 211 and exit the device.

The front plate 100 is located a given distance in front of the PDP 200. The front plate 100 has a function to intercept electromagnetic waves and near-infrared rays leaking from the PDP and correct (adjust) the luminescent colors of the PDP. It also has a function to prevent reflection of external light and improve daylight contrast. Hence, the front plate according to the present embodiment includes components disposed in the following order from the external light incidence side: a light guide array sheet 110 which increases daylight contrast; a colored resin sheet 103 which contains a pigment (dye) which absorbs near-infrared rays and corrects the luminescent colors; an electromagnetic wave shield layer 102; and an anti-reflection layer 101 which prevents reflection of incident light from the PDP.

The colored resin sheet 103 is a sheet of transparent resin such as polyethylene terephthalate (PET) or polycarbonate mixed with a colorant with a prescribed total light transmittance and a wavelength-selective absorptive colorant (dye), which is used as the base of the front plate 100. The wavelength-selective absorptivity is obtained by adding a wavelength-selective absorptive compound which is absorptive in a specific frequency band, to the transparent resin and dispersing it. In other words, near-infrared rays are intercepted and the PDP's luminous colors are corrected by adding one or more kinds of colorants including a near-infrared absorptive colorant and/or a colorant derived from red phosphor which absorbs orange light (wavelength range 550-610 nm).

The electromagnetic wave shield layer 102 is a conductive layer which is bonded to the PDP side of the colored resin sheet 103 through an adhesive layer (not shown) to intercept electromagnetic waves leaking from the PDP. For example, this layer consists of a transparent base material (not shown) with a metal mesh (not shown) thereon having a lattice-like arrangement of holes (see Japanese Patent Application Laid-Open Publication No. 2003-5663).

An anti-reflection layer 101 which transmits incident light from the PDP efficiently is formed on the electromagnetic wave shield layer 102 of the front plate 100 which faces the PDP 200.

A light guide array sheet 110 which increases daylight contrast is formed on the side of the colored resin sheet 103 which is opposite to the PDP. The light guide array sheet 110 includes a transparent resin base material on which light guides 111 with a virtually trapezoidal cross section extending parallel to the display electrodes 212 (namely in the left-right or horizontal direction of the PDP screen) are disposed at given regular intervals one-dimensionally in the direction parallel to the address electrodes (namely in the top-bottom or vertical direction of the PDP screen). The function of the light guides 111 will be described later.

Acrylic UV curing resin is used for the transparent base material of the light guide array sheet 110. For example, a light guide array sheet is formed as follows. UV curing resin material is coated on the molding surface of an embossing roll die and sheet resin base material is supplied to the embossing roll die and cured by UV radiation; at the same time light guides as resin moldings are bonded to the transparent base material by polymerization. Then, a metal reflection layer 120 and a black light-absorbing layer 122 are formed on the inclined portions (also called the lateral side) 113 of the light guides 111 sequentially and their apexes 115 are polished to make a light guide array sheet 110 and this light guide array sheet 110 is bonded to the colored resin sheet 103 through an adhesive layer (not shown). The process of making the light guide array sheet 110 is not limited to the abovementioned process; any of other various known manufacturing processes using a different transparent resin base material may be adopted. For example, a melting extrusion method as described in Japanese Patent Application Laid-Open Publication No. 2001-154597 may be used in which the surface of molten sheet resin base material extruded by an extruder is embossed using an embossing roll die.

Figure 2:
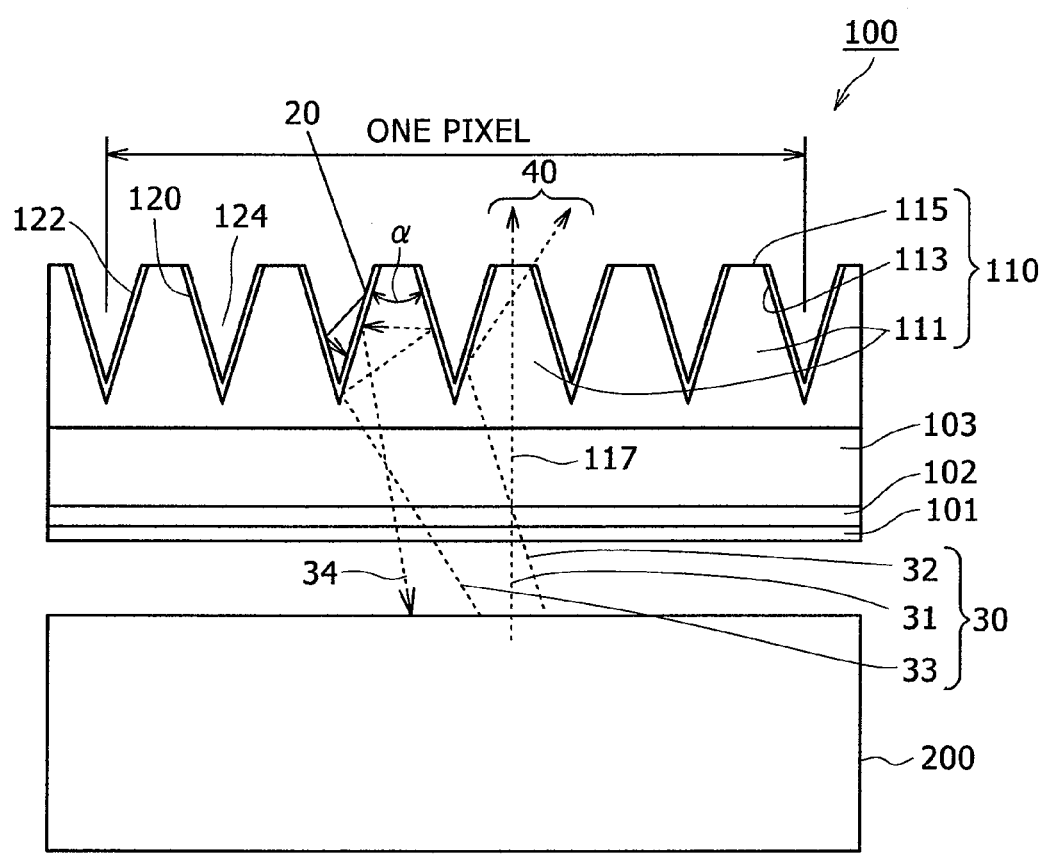
FIG. 2 is a schematic sectional view of the display device according to the first embodiment in a PDP screen vertical direction.

Next, the light guide array sheet will be detailed referring to FIG. 2. FIG. 2 is a schematic sectional view of the main part of the display device shown in FIG. 1. FIG. 2 schematically shows the sectional structure of an area for one pixel (unit pixel) in the PDP screen vertical (top-bottom) direction parallel to the address electrodes.

As illustrated in FIG. 2, the cross section of each light guide 111 of the light guide array sheet 110 has a virtually convex shape which is tapered toward the light exit side. In this example, the sectional shape is virtually trapezoidal with its apex 115 as the upper edge. In this embodiment, a metal reflection layer 120 is formed on the light guide 111's portion except the apex 115 as an optical exit aperture (light-transmitting area), namely the inclined portion 113 as the lateral side of the light guide 111, for example, by sputtering with aluminum. In addition, a black light-absorbing layer 122 which absorbs external light 20 is formed on the metal reflection layer 120. Furthermore, a natural number of light guides (at least two, in this case, six) are provided in an area for one pixel (unit pixel) along the screen vertical direction of the PDP 200). Considering the problem related to sampling, it is desirable to use five or more light guides. In order to increase the light-absorbing area and enhance daylight contrast, area $S_L$ of the apex 115 should not be larger than area $S_{NL}$ of the inclined portion 113 (hereinafter called "inclined portion area") when seen the light guide 111 from a viewer (not shown).

Since the light guide array sheet 110 is thus structured, out of incident light 30 from the PDP entering each light guide 111 of the light guide array sheet 110 of the front plate 100, incident light 31 exits directly from the apex 115 of the light guide 111 but out of incident light 32 impinging on the inclined portion 113 of the light guide 111, part of it is totally reflected by the inclined portion 113 and other part of it is transmitted through the inclined portion 113 and reflected by the metal reflection layer 120 formed on the inclined portion 113 and this process is repeated inside the light guide 111 while the light moves toward the exit from the apex 115 as outgoing light 40. In other words, incident light 32 impinging on the inclined portion 113 is reflected by the inclined portion 113 of the light guide 111 or the metal reflection layer 120 before exiting the device (hereinafter the inclined portion 113 and the metal reflection layer 120 which reflect incident light may be sometimes collectively called the "reflection area").

Since the cross section of each light guide 111 in its screen vertical direction has a tapered virtually convex shape (in this case, virtually trapezoidal), as shown in FIG. 2 the angle of outgoing light 40 with respect to the main optical axis 117 of the light guide 111 is larger than the angle of incident light 32 with respect to the main optical axis 117, leading to better directional characteristics in the screen vertical direction. The directional characteristics can be changed by vertex angle α formed by the lateral inclined portion 113 of the light guide 111. In other words, the light diffusion characteristics (directional characteristics) in the screen vertical direction can be controlled by vertex angle α.

As mentioned above, light within the critical angle as determined by the inclination angle of the inclined portion 113 is transmitted through the inclined portion 113, but in this embodiment it is reflected by the metal reflection layer 120 formed on the inclined portion 113, which minimizes deterioration in the transmittance for incident light from the PDP 200 entering the front plate 100 and ensures that the incident light exits the device efficiently.

Out of incident light 30, incident light 33 whose angle of incidence with respect to the normal line of the inclined portion 113 is more than a prescribed angle is repeatedly reflected between the lateral inclined portions 113 of light guides 111 and then returns to the PDO 200 as returned light 34 as shown FIG. 2. This returned light is again reflected by the PDP (for example, phosphor) and then goes back to the front plate 100 and can be reused.

Leakage of returned light 34 into an adjacent pixel area (not shown) would cause the image quality to deteriorate. However, in this embodiment, since plural light guides are provided for one pixel (unit pixel), there is less leakage of returned light into an adjacent pixel area and the image quality is less likely to deteriorate.

However, regarding incident light from the PDP 200 which has a virtually uniform light intensity distribution (Lambert distribution), if its angle of incidence with respect to the normal line of the inclined portion 113 exceeds the prescribed angle, it becomes returned light, which limits the PDP 200's inherent directional characteristics (Lambert distribution characteristics) and thus narrows the directivity of the outgoing light 40 from the light guide 111 in the PDP screen vertical direction. Although the directivity in the PDP screen vertical direction can be broadened by the vertex angle α formed by the inclined portion 113, it is difficult to reproduce the PDP 200's inherent directional characteristics. In the screen horizontal direction, there is anything that intercepts light from the PDP and the directional characteristics in the PDP screen horizontal direction are very good.

Viewers do not always look at an image on a display device facing its front screen squarely but may look at it sideways or obliquely. For this reason, the directivity in the screen horizontal (right-left) direction should be broad enough. On the other hand, as far as directivity in the screen vertical (top-bottom) direction is concerned, viewers rarely look at the screen from an extremely high or low position, directivity in the screen vertical direction need not be so broad, as is commonly known.

For this reason, in this embodiment, light guides extending along the PDP screen horizontal direction are disposed one-dimensionally along the PDP screen vertical direction. Therefore, as explained above, although directivity in the PDP screen vertical direction is narrow, in the PDP screen horizontal direction there is anything that may intercept light from the PDP and thus directivity in the PDP screen horizontal direction is not restricted and can be broadened.

As mentioned above, returned light 34 hardly leaks into an adjacent pixel area. However, when returned light 34 is to be reduced, returned light can be reduced by decreasing the inclination angle, namely decreasing the vertex angle α of the light guide. In this case, directivity in the screen vertical direction is narrowed; however it may be improved, for example, by making fine concaves and convexes on the flat apex 115 as the light exit plane of the light guide 111 to create a diffusion plane 118 so that outgoing light is diffused.

Figure 3:
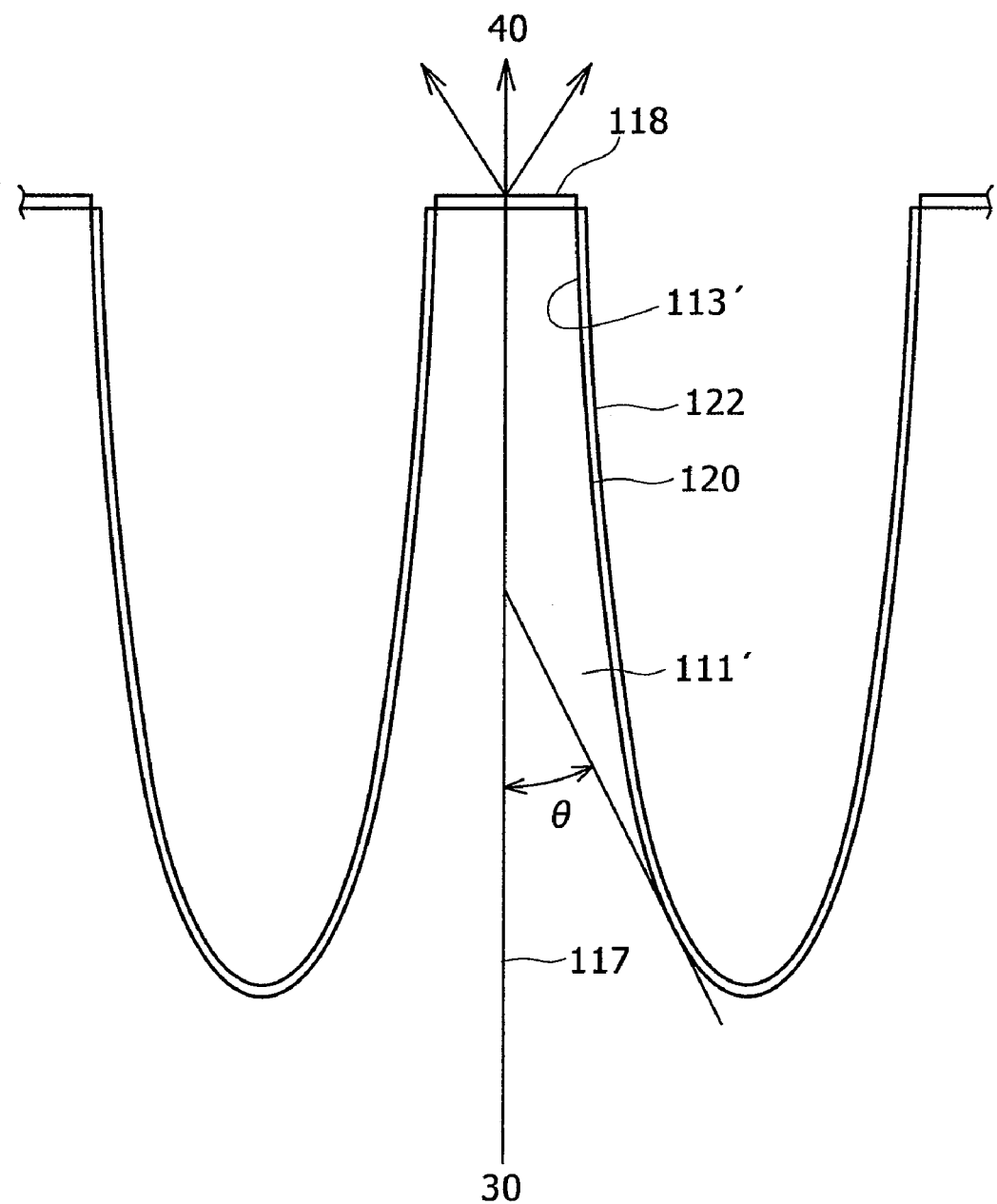
FIG. 3 shows a variation of a light guide according to the first embodiment.

The shape of the inclined portion 113 of each light guide 111 for reduction of returned light 34 is not limited to such a shape that the bottom and apex of the light guide are connected by a straight line. For instance, in a light guide 111' as shown in FIG. 3, the angle θ of the tangent line of the inclined portion 113' with respect to the main optical axis 117 gradually decreases toward the light exit side, namely the sectional shape of the inclined portion 113' may be curved downward (toward the light entrance side). As the angle θ of the tangent line of the inclined portion 113' gradually decreases toward the light exit side, returned light is reduced and transmittance is improved.

Looking back to FIG. 2, external light 20 impinging on a recess 124 as a groove (wedge-like) formed between neighboring light guides 111 is partially absorbed by the light-absorbing layer 122 on the inclined portion 113 of the light guide 111 and reflected light impinges on a light-absorbing layer 122 adjacent to the recess 124. Then part of it is absorbed and other part of it is reflected and impinges on an adjacent light-absorbing layer 122. This process is repeated and the external light 20 which has impinged on the recess 124 is attenuated and external light reflection is thus reduced.

As mentioned above, since the area $S_L$ of the apex of the light guide 111 is smaller than the area $S_{NL}$ of its inclined portion, reflection of external light 20 is reduced effectively. In the light guide 111, incident light from the PDP is reflected by the metal reflection layer and efficiently guided to exit the device. Hence, according to this embodiment, a synergic effect of the above phenomena improves daylight contrast.

In this embodiment, since six light guides 111 extending along the PDP screen horizontal direction are disposed in an area for one pixel (unit pixel) along the PDP screen vertical direction, when viewers look at the display device with the front plate attached, black stripe-like bands (hereinafter called "black stripes") extending along the PDP screen horizontal direction appear as finely arranged along the PDP screen vertical direction so that viewers can view an image without feeling that the black stripes are visually annoying.

As explained so far, according to this embodiment, while the display panel's inherent directional characteristics in the PDP screen horizontal direction are maintained adequate, deterioration in the transmittance for outgoing light from the display panel is minimized and daylight contrast is improved.

Second Embodiment

Next, a second embodiment of the invention will be described referring to FIGS. 4 and 5.

Figure 4:
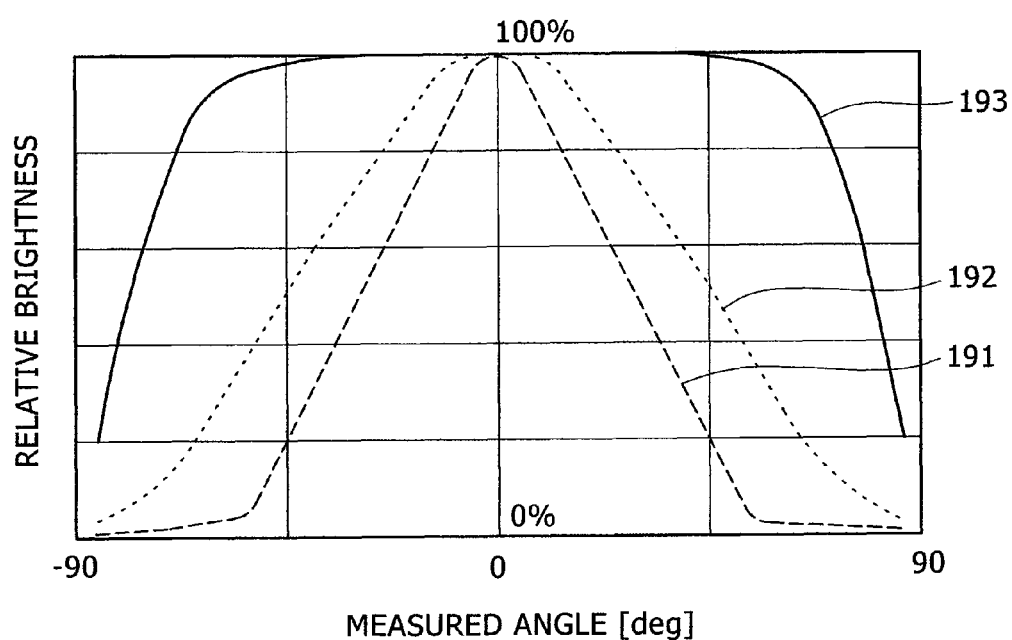
FIG. 4 shows directional characteristics in a screen vertical direction in connection with the shape of a lateral inclined portion of a light guide.

FIG. 4 schematically shows directional characteristics in the screen vertical direction in connection with the shape of the lateral inclined portion of the light guide.

In FIG. 4, characteristic curve 193 represents directivity without a light guide array sheet and characteristic curve 191 represents directivity with the light guide array sheet 110 according to the first embodiment. As shown in FIG. 4, directivity in the screen vertical direction for the light guide array sheet with a virtually trapezoidal cross section in the first embodiment is narrow. The light guide shape according to the second embodiment which provides a broader directivity 192 than the directivity 191 will be described below.

Figure 5:
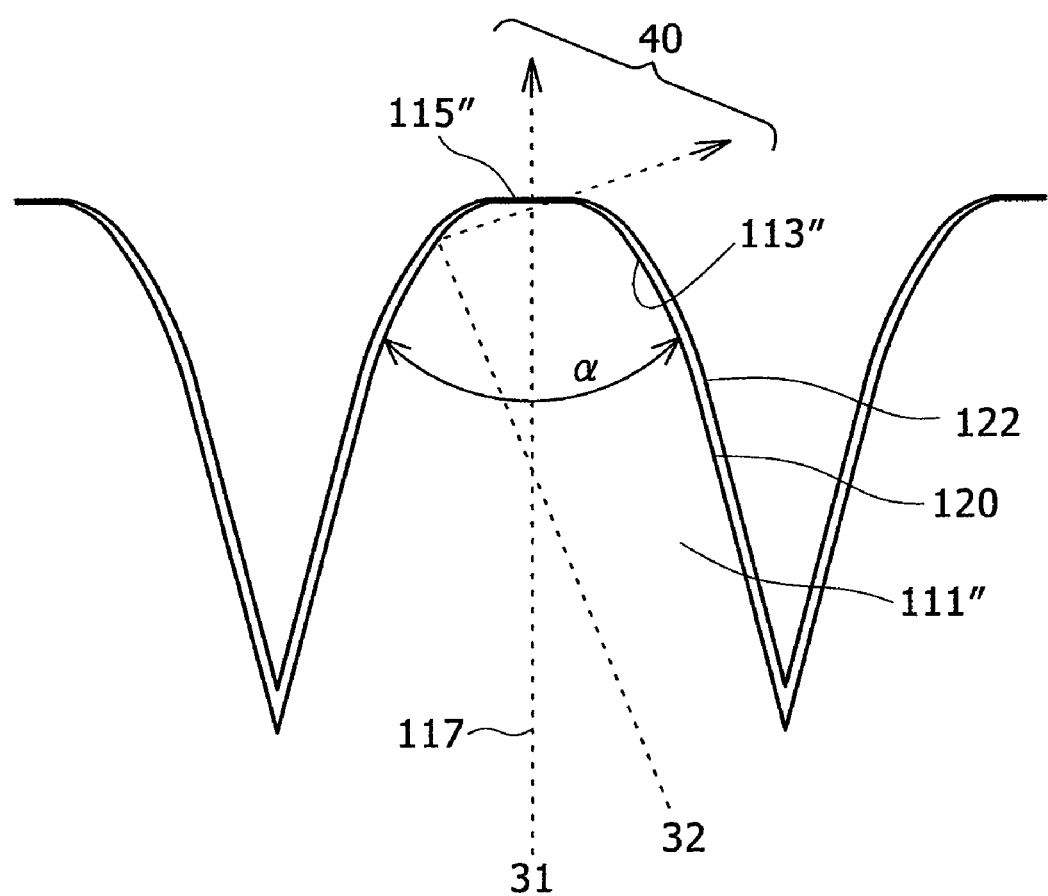
FIG. 5 is a schematic sectional view of a light guide according to a second embodiment in a screen vertical direction.

FIG. 5 schematically shows part of the cross section of a light guide according to the second embodiment in the screen vertical direction.

As shown in FIG. 5, in this embodiment, the sectional shape (namely, the shape of the lateral inclined portion 113") of the light guide 111" in the screen vertical direction is reverse to that of the light guide 111' in FIG. 3 or curved upward (curved toward the light exit side). Therefore, the vertex angle α of the inclined portion 113" is larger in a region nearer to the apex 115". Consequently, due to the lens effect of the reflection area (reflection plane) composed of the inclined portion 113" and the metal reflection layer 120, incident light 32 reflected by a region of the inclined portion 113" near the apex 115" of the light guide 111" exits the device at a large angle with respect to the main optical axis 117. This means that outgoing light 40 is widely diffused and directivity is broadened.

Third Embodiment

Although in the first embodiment the light-absorbing layer 122 lies covering the metal reflection layer 120 formed on the inclined portion 113 of the light guide 111, the present invention is not limited thereto.

Figure 6:
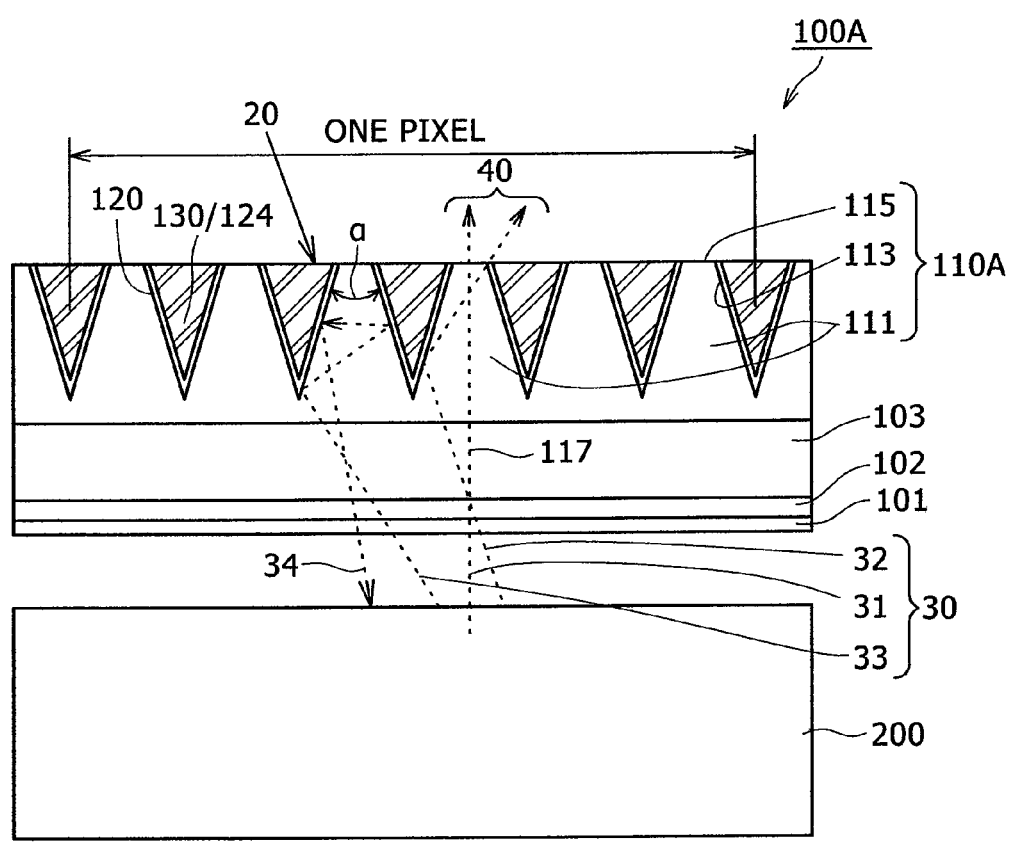
FIG. 6 is a schematic sectional view of a display device according to a third embodiment in a PDP screen vertical direction.

FIG. 6 schematically shows the cross section of a display device according to the third embodiment in the PDP screen vertical direction. As in FIG. 2, an area for one pixel (unit pixel) is indicated here. In FIG. 6, elements with the same functions as those in FIG. 2 are designated by the same reference numerals and their descriptions are omitted.

As apparent from FIG. 6, in a front plate 100A according to the third embodiment, black light absorber 130 is filled in the recess 124 instead of the light-absorbing layer 122 which covers the metal reflection layer 120 of the front plate 100 in the first embodiment in order to absorb external light. The other features are the same as in the first embodiment.

In this embodiment, since the light absorber 130 absorbs external light 20, daylight contrast is further improved.

If the black light absorbers 130 are made of a conductive material (for example, carbon) and an electrode pattern is created by connection of light absorbers at the ends of the light guide array sheet 110A in the horizontal direction and it is connected to the ground potential (GND), this can be used as a shield which reduces unwanted electromagnetic radiation.

Fourth Embodiment

In the foregoing embodiments, the front plate 100 lies a given distance in front of the PDP 200. In this case, it is necessary to install an anti-reflection layer 101 on the incidence plane of the front plate in order to prevent light emitted from the PDP from being repeatedly reflected between the front plate and the PDP.

In the fourth embodiment, the front plate which includes a light guide array sheet is directly attached to the PDP. When the front plate is directly stuck to the PDP, the possibility of an image blurring due to multiple reflection is reduced.

Figure 7:
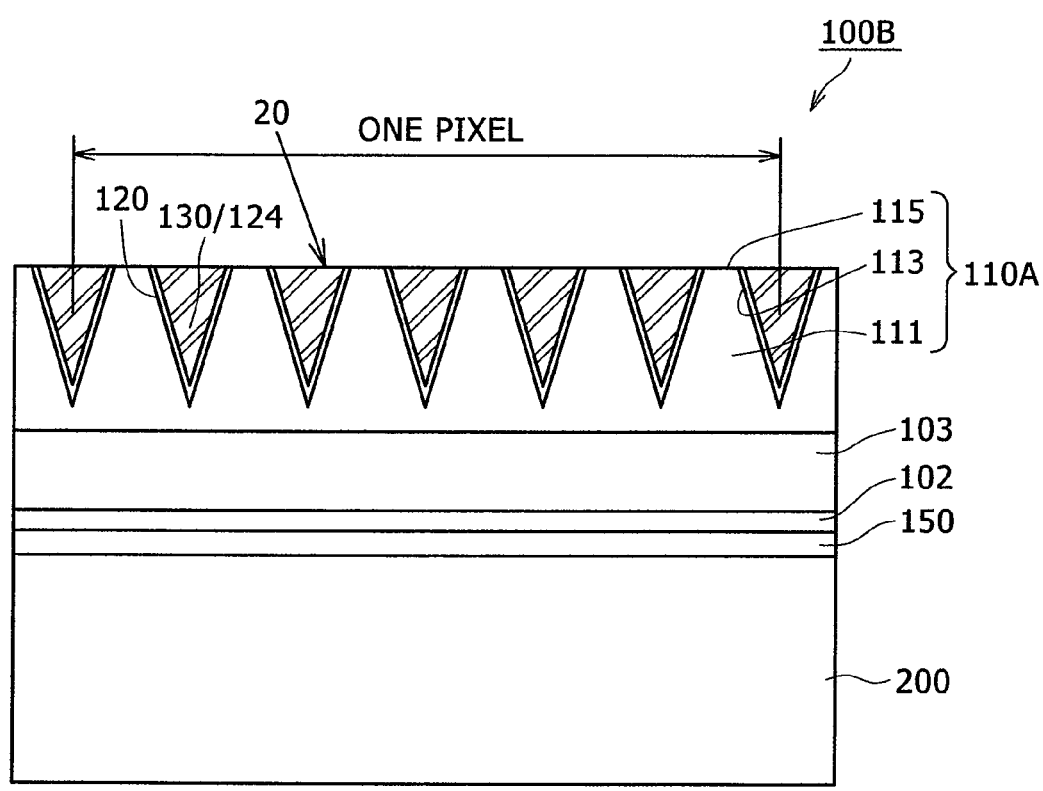
FIG. 7 is a schematic sectional view of a display device according to a fourth embodiment in a PDP screen vertical direction.

FIG. 7 schematically shows the cross section of a display device according to the fourth embodiment in the PDP screen vertical direction. In FIG. 7, elements with the same functions as those in FIGS. 1, 2, and 6 are designated by the same reference numerals and their descriptions are omitted.

As illustrated in FIG. 7, the display device according to this embodiment uses a front plate 100B which is basically the same as the front plate 100A in the third embodiment but has no anti-reflection layer and is directly stuck to the PDP 200 through an adhesive layer 150.

Since the front plate 100B is directly stuck to the PDP 200, an impact on the display device would be transmitted through the front plate to the PDP 200. In order to absorb the impact, for example, an adhesive layer 150 made of an adhesive material (for example, an acrylic adhesive) as described in Japanese Patent Application Laid-Open Publication No. 2002-260539 lies between the PDP 200 and the front plate 100B. Its thickness required to absorb the impact is in the range of 0.5-2.0 mm or so. Another example of the adhesive layer material used here may be a transparent gel adhesive made of a swollen 3D cross-linked polymer as described in Japanese Patent Application Laid-Open Publication No. 2005-22365.

Fifth Embodiment

Next, a fifth embodiment as a variation of the fourth embodiment in which the light guide array sheet is directly stuck to the PDP will be described.

Figure 8:
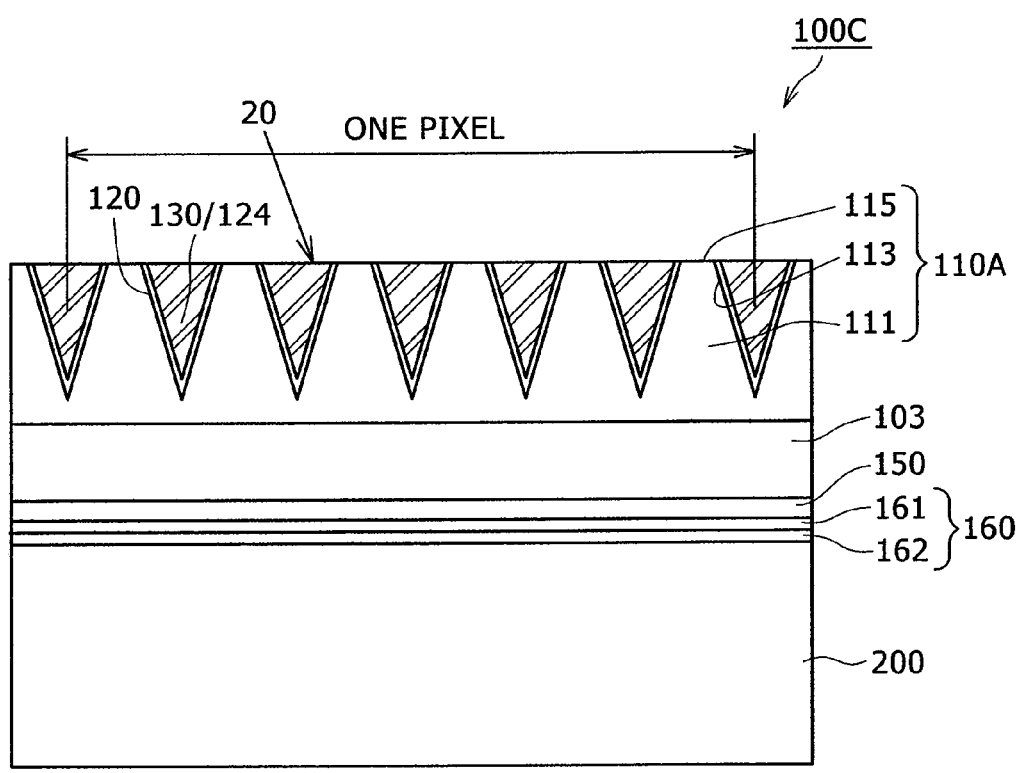
FIG. 8 is a schematic sectional view of a display device according to a fifth embodiment in a PDP screen vertical direction.

FIG. 8 schematically shows the cross section of a display device according to the fifth embodiment in the PDP screen vertical direction. In FIG. 8, elements with the same functions as those in FIGS. 1, 2, 6, and 7 are designated by the same reference numerals and their descriptions are omitted.

In this embodiment, first an electromagnetic wave shield layer 160 is integrally formed on the PDP 200, then a front plate 110C, in which a colored resin sheet 103 and a light guide array sheet 110A are stacked one upon the other, is bonded to the electromagnetic wave shield layer 160 through an adhesive layer 150.

There are various methods of integrally forming an electromagnetic wave shield layer 160 on the PDP 200. One example is to stick a metal mesh sheet 162 with a prefabricated metal mesh to the PDP 200 using a transparent adhesive. Glass paste may be used as the transparent adhesive. More specifically, by coating the metal mesh sheet 162 placed on the PDP 200 with glass paste and burning it, the metal mesh sheet 162 is sandwiched between the PDP 200 and a glass layer 161 formed by burning, creating an electromagnetic wave shield layer 160 which is integral with the PDP 200. The electromagnetic wave shield layer 160 has a high mechanical strength because its metal mesh is embedded in the glass layer 161. Particularly, if the wire diameter (wire width) of the metal mesh of the electromagnetic wave shield layer 160 which is formed integrally with the PDP 200 is 40 microns or more for the purpose of lowering the metal mesh surface resistance (for example, to 0.1 ohm/square or less), the impact strength of the electromagnetic wave shield layer 160 is increased and thus the impact strength of the PDP 200 is increased. Moreover, if the glass paste in use contains $SiO_2$-based glass powder including at least one rare earth element among Sc, Y, La, Pr, Nd, Pm, Sm, Eu, Gd, Tb, Dy, Ho, Er, Tm, Yb and Lu as described in Japanese Patent Application Laid-Open Publication No. H10(1998)-83531, the publication of an application filed by the present applicant, the mechanical strength of the burnt glass layer is increased and the impact strength of the PDP 200 is increased.

Since this embodiment does not use an electromagnetic wave shield layer with a metal mesh on film, even when the light guide array sheet is directly stuck to the PDP 200, a heat source, decline in light transmittance due to resin film deterioration caused by the PDP's heat is unlikely and thus reliability is enhanced.

In the foregoing embodiments, an electromagnetic wave shield layer is integrated with the PDP 200 as a completed display panel; however, the present invention is not limited thereto. Another possible approach is as follows. The above-mentioned electromagnetic wave shield layer is integrated with the upper glass substrate 211 as a material in a way that it lies on the upper glass substrate 211's side opposite to its side for display electrode formation. The upper panel is made using the upper glass substrate 211 integrated with the electromagnetic wave shield layer and combined with a lower panel to complete the PDP 200, then a front plate 100C is bonded to it through an adhesive layer 150 to finish the display device. This approach reduces defect-related cost even if defects occur in the electromagnetic wave shield layer manufacturing process.

In this case, it is also possible that a metal coating (for example, Cu coating) is made by sputtering on the upper glass substrate 211 as a material before the formation of display electrodes thereon, and a metal mesh is made by etching the coating or by applying metal paste to the substrate and burning it; then glass paste is applied to it and burning is done to make an electromagnetic wave shield layer integral with the upper glass substrate.

In the foregoing embodiments, it is assumed that light guides have high transmittance and do not attenuate the intensity of light emitted from the display panel; however, the present invention is not limited thereto. For example, their transmittance may be as low as desired in order to obtain various optical characteristics.

What is claimed is:

1. A front sheet located on a front side of a display panel in which pixels are arranged in a matrix pattern, comprising:
   a light guide which extends in a first direction of the display panel and has a convex cross section in a second direction of the display panel perpendicular to the first direction of the display panel, wherein:
   a plurality of the light guides are disposed in the second direction of the display panel;
   an apex of the light guide is a light-transmitting area and a light reflection area and a light-absorbing area are sequentially formed in the first direction of the display panel on the lateral inclined portion of the light guide;
   the light-absorbing area is disposed between neighboring ones of the light guides in a way to fill the space between them;
   the display panel's light intensity in distribution is diffused; and
   wherein part of light diffused from the display panel is reflected by the reflection area at least once and goes toward an image viewer and other part of the light is reflected by the reflection area two or more times and once returns to the display panel and this light is again reflected by the display panel, and reflected by the reflection area or goes directly toward a viewer.

2. The front sheet according to claim 1, wherein a plurality of the light guides are disposed in an area for one pixel in the second direction of the display panel.

3. The front sheet according to claim 1, wherein light diffusion characteristics in the second direction are controlled by a shape of a reflection area provided in the light guide's area other than the apex.

4. A front sheet located on a front side of a display panel in which pixels are arranged in a matrix pattern, comprising:
   a light guide which extends in a first direction of the display panel and has a convex cross section in a second direction of the display panel perpendicular to the first direction of the display panel;
   a light guide array sheet in which the light guides are formed;
   an anti-reflection layer; and
   an electromagnetic wave shield layer,
   wherein:
   a plurality of the light guides are disposed in the second direction of the display panel;
   an apex of the light guide is a light-transmitting area and a light reflection area and a light-absorbing area are sequentially formed in the first direction of the display panel on the lateral inclined portion of the light guide;
   the light-absorbing area is disposed between neighboring ones of the light guides in a way to fill the space between them; and
   wherein the light guide array sheet, anti-reflection layer and electromagnetic wave shield layer are connected with each other.

5. A front sheet located on a front side of a display panel in which pixels are arranged in a matrix pattern, comprising:
a light guide which extends in a first direction of the display panel and has a convex cross section in a second direction of the display panel perpendicular to the first direction of the display panel, wherein:
a plurality of the light guides are disposed in the second direction of the display panel;
an apex of the light guide is a light-transmitting area and a light reflection area and a light-absorbing area are sequentially formed in the first direction of the display panel on the lateral inclined portion of the light guide; and
the light-absorbing area is disposed between neighboring ones of the light guides in a way to fill the space between them,
wherein, in the cross section in the second direction of the light guide, the inclined portion of the light guide is formed as a curved shape and an angle of a tangent line of the inclined portion with respect to an optical axis of the light guide gradually decreases toward a light exit side.

6. A front sheet located on a front side of a display panel in which pixels are arranged in a matrix pattern, comprising:
a light guide which extends in a first direction of the display panel and has a convex cross section in a second direction of the display panel perpendicular to the first direction of the display panel, wherein:
a plurality of the light guides are disposed in the second direction of the display panel;
an apex of the light guide is a light-transmitting area and a light reflection area and a light-absorbing area are sequentially formed in the first direction of the display panel on the lateral inclined portion of the light guide;
the light-absorbing area is disposed between neighboring ones of the light guides in a way to fill the space between them, and
wherein, in the cross section in the second direction of the light guide, the inclined portion of the light guide is formed as a curved shape and an angle of a tangent line of the inclined portion with respect to an optical axis of the light guide gradually increases toward a light exit side.

7. A display device comprising:
a display panel in which pixels are arranged in a matrix pattern; and
a front sheet located on a front side of the display panel; wherein:
the front sheet includes a light guide array sheet in which a plurality of light guides are disposed in a second direction of the display panel, each such light guide extending in a first direction of the display panel perpendicular to the second direction of the display panel and having a convex cross section in the second direction of the display panel;
an apex of the light guide is a light-transmitting area, and a light reflection area and a light-absorbing area are sequentially formed in the first direction of the display panel on the lateral inclined portion of the light guide;
the light-absorbing area is disposed between neighboring ones of the light guides in a way to fill the space between them,
part of light diffused from the display panel is reflected by the reflection area at least once and goes toward an image viewer and other part of the light is reflected by the reflection area two or more times and once returns to the display panel and this light is again reflected by the display panel, and reflected by the reflection area or goes directly toward a viewer, and
wherein the display panel's light intensity in distribution is diffused.

8. The display device according to claim 7,
wherein the front sheet is in close contact with the display panel's front side or a given distance from the display panel's front side.

9. The display device according to claim 7,
wherein the light guide array sheet is located on the front sheet's light exit side.

10. The display device according to claim 7,
wherein a plurality of the light guides are disposed in an area for one pixel in the second direction of the display panel.

11. A display device comprising:
a display panel in which pixels are arranged in a matrix pattern; and
a front sheet located on a front side of the display panel; wherein:
the front sheet includes a light guide array sheet in which a plurality of light guides are disposed in a second direction of the display panel, each such light guide extending in a first direction of the display panel perpendicular to the second direction of the display panel and having a convex cross section in the second direction of the display panel;
an apex of the light guide is a light-transmitting area, and a light reflection area and a light-absorbing area are sequentially formed in the first direction of the display panel on the lateral inclined portion of the light guide;
the light-absorbing area is disposed between neighboring ones of the light guides in a way to fill the space between them, and
wherein, in the cross section in the second direction of the light guide, the inclined portion of the light guide is formed as a curved shape and an angle of a tangent line of the inclined portion with respect to an optical axis of the light guide gradually decreases toward a light exit side.

12. A display device comprising:
a display panel in which pixels are arranged in a matrix pattern; and
a front sheet located on a front side of the display panel; wherein:
the front sheet includes a light guide array sheet in which a plurality of light guides are disposed in a second direction of the display panel, each such light guide extending in a first direction of the display panel perpendicular to the second direction of the display panel and having a convex cross section in the second direction of the display panel;
an apex of the light guide is a light-transmitting area, and a light reflection area and a light-absorbing area are sequentially formed in the first direction of the display panel on the lateral inclined portion of the light guide;
the light-absorbing area is disposed between neighboring ones of the light guides in a way to fill the space between them, and
wherein, in the cross section in the second direction of the light guide, the inclined portion of the light guide is formed as a curved shape and an angle of a tangent line of the inclined portion with respect to an optical axis of the light guide gradually increases toward a light exit side.

* * * * *